(12) United States Patent
Lin

(10) Patent No.: US 6,816,104 B1
(45) Date of Patent: Nov. 9, 2004

(54) ANALOG-TO-DIGITAL CONVERTER UTILIZING A TIMER FOR INCREASED RESOLUTION

(75) Inventor: Chi-Cheng Lin, Tao-Yuan (TW)

(73) Assignee: BenQ Corporation, Yao-Yuan Hsien (TW)

( * ) Notice: Subject to any disclaimer, the term of this patent is extended or adjusted under 35 U.S.C. 154(b) by 0 days.

(21) Appl. No.: 10/604,359

(22) Filed: Jul. 14, 2003

(51) Int. Cl.$^7$ .............................................. H03M 1/12
(52) U.S. Cl. ...................... 341/172; 341/143; 341/155; 341/158
(58) Field of Search ................................ 341/143, 155, 341/158, 162, 163, 172

(56) References Cited

U.S. PATENT DOCUMENTS 5,068,399 A * 11/1991 Naito et al. ................. 560/212
5,568,143 A * 10/1996 Hutchison et al. .......... 341/139
5,691,720 A * 11/1997 Wang et al. ................. 341/143
6,538,582 B1   3/2003 Lin t al.

* cited by examiner

Primary Examiner—Michael Tokar
Assistant Examiner—Khai Nguyen
(74) Attorney, Agent, or Firm—Winston Hsu

(57) ABSTRACT

An analog-to-digital converter includes a capacitor for storing charge and a current source for flowing current through the capacitor for charging the capacitor. The analog-to-digital converter also contains a switch for controlling flow of current from the current source to the capacitor, a comparator for outputting a first comparison value when an analog input voltage is approximately equal to a voltage across the capacitor, and a timer for calculating a charging period of time needed for the voltage across the capacitor to become equal to the analog input voltage. A controller is used for controlling operation of the switch, for starting the timer when the switch electrically connects the current source to the capacitor for charging the capacitor, for stopping the timer when the comparator outputs the first comparison value, and for converting the charging period of time calculated by the timer into a digital output voltage.

15 Claims, 4 Drawing Sheets

ANALOG-TO-DIGITAL CONVERTER UTILIZING A TIMER FOR INCREASED RESOLUTION

BACKGROUND OF INVENTION

1. Field of the Invention

The present invention relates to an analog-to-digital converter, and more specifically, to an analog-to-digital converter that calculates a digital output voltage based on a time required to charge a capacitor.

2. Description of the Prior Art

Conventionally, analog-to-digital converters are used to convert an analog input voltage into a digital output voltage of a fixed resolution, which determines the precision of the analog-to-digital converter. Each analog-to-digital converter is usually rated to handle a specific range of analog input voltages to avoid saturating the analog-to-digital converter.

Please refer to FIG. 1. FIG. 1 is a schematic diagram of an analog-to-digital converter 10 according to the prior art. The analog-to-digital converter 10 contains input pins 16 and 18 for inputting an analog voltage to the analog-to-digital converter 10. Input pins 12, 14, and 20 are respectively used for providing a voltage input, a ground reference, and a voltage reference to the analog-to-digital converter 10. The analog-to-digital converter 10 calculates an analog voltage difference across input pins 16 and 18, converts the analog voltage into a digital output voltage, and outputs the digital output voltage on a plurality of output pins 25. The number of output pins 25 depends on the resolution of the analog-to-digital converter 10, and the analog-to-digital converter 10 shown in FIG. 1 has n output pins 25 corresponding to an n-bit resolution. For example, an eight-bit resolution would require eight output pins 25 to output the digital output voltage.

Unfortunately, the analog-to-digital converter 10 contains a fixed resolution which is determined according to the complexity of the circuitry inside the analog-to-digital converter 10. Changing the resolution of the analog-to-digital converter 10 requires designing the analog-to-digital converter 10 all over from scratch, and very little of the original design can be salvaged.

SUMMARY OF INVENTION

It is therefore a primary objective of the claimed invention to provide an analog-to-digital converter utilizing a timer for conveniently adjusting the resolution of the analog-to-digital converter in order to solve the above-mentioned problems.

According to the claimed invention, an analog-to-digital converter includes at least one input pin for receiving an analog input voltage, a capacitor for storing charge and producing a voltage across the capacitor, and a current source for flowing current through the capacitor for charging the capacitor. The analog-to-digital converter also contains a first switch electrically connected between the current source and the capacitor for controlling flow of current from the current source to the capacitor, a comparator for outputting a first comparison value when the analog input voltage is approximately equal to the voltage across the capacitor, and a timer for calculating a charging period of time needed for the voltage across the capacitor to become equal to the analog input voltage. Before the capacitor is charged, it is discharged to remove all remaining charge. Then, the timer starts calculating the charging period of time when the first switch electrically connects the current source to the capacitor for charging the capacitor and stops calculating the charging period of time when the comparator outputs the first comparison value. A controller is used for controlling operation of the first switch, for starting the timer when the first switch electrically connects the current source to the capacitor for charging the capacitor, for stopping the timer when the comparator outputs the first comparison value, and for converting the charging period of time calculated by the timer into a digital output voltage.

It is an advantage of the claimed invention that resolution of the analog-to-digital converter can easily be adjusted by changing the clock rate of the timer. The analog-to-digital converter can be used in a variety of applications that require a range of different resolutions, or for any application that requires high resolution and for which a fast conversion time is not critical.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
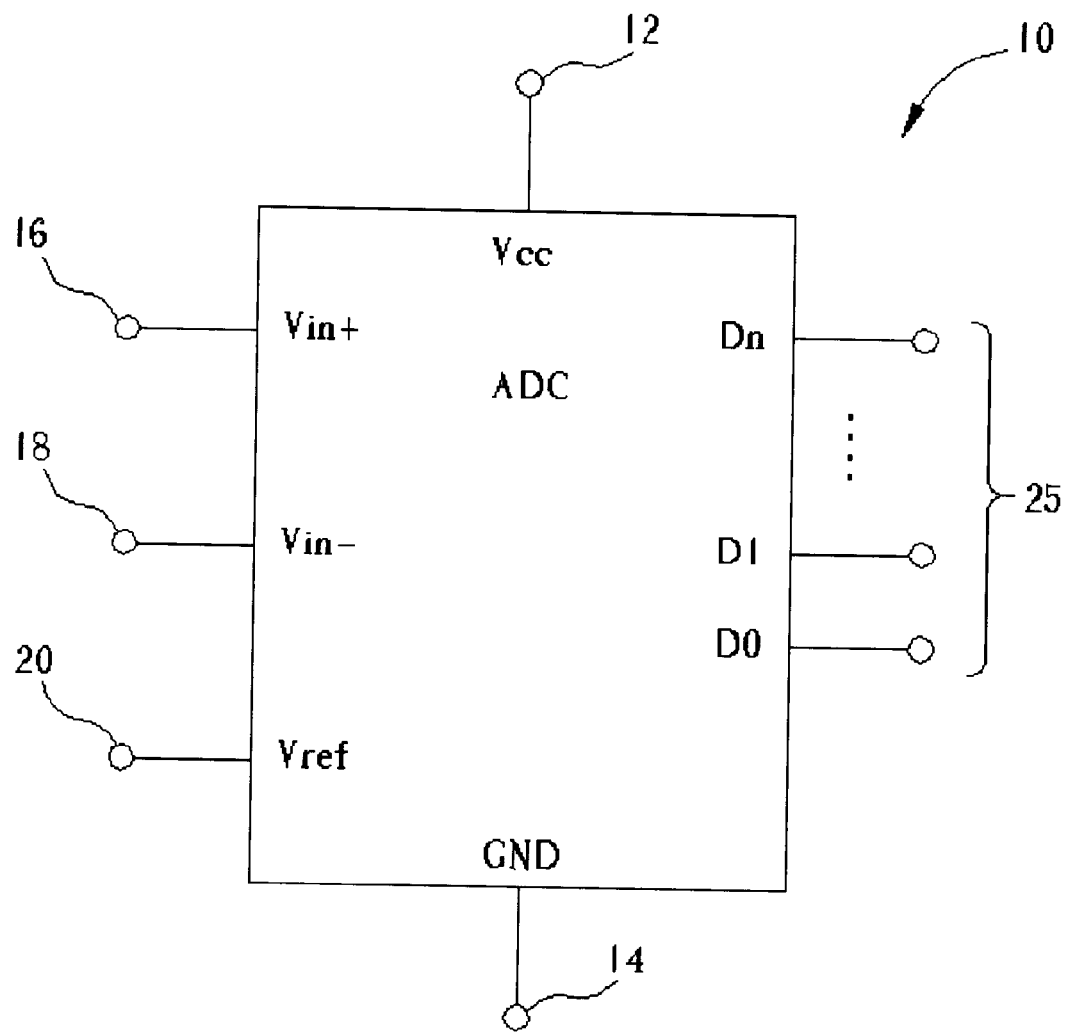
FIG. 1 is a schematic diagram of an analog-to-digital converter according to the prior art.
Figure 2:
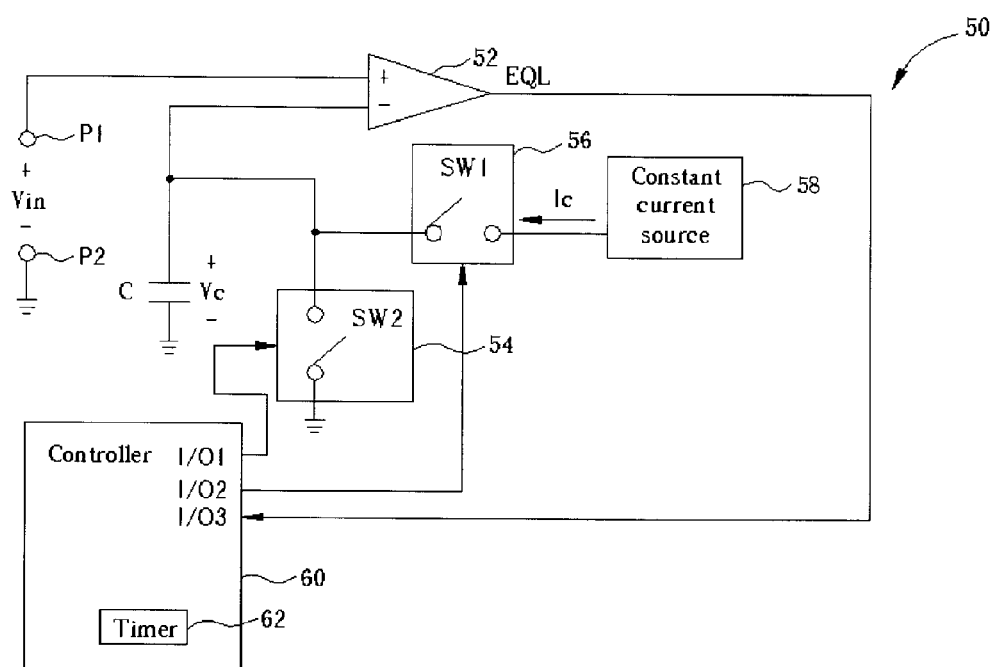
FIG. 2 is a block diagram of an analog-to-digital converter according to the present invention.

Please refer to FIG. 2. FIG. 2 is a block diagram of an analog-to-digital converter 50 according to the present invention. The analog-to-digital converter 50 contains a capacitor C which is used to store charge and produce a voltage Vc across the capacitor C. The capacitor C is electrically connected to a constant current source 58 through a first switch 56. When the first switch 56 is turned on, current Ic flows from the constant current source 58 through the capacitor C for charging the capacitor C and raising the voltage Vc across the capacitor C. When the first switch 56 is turned off, the current Ic cannot flow through the capacitor C. Since the current Ic produced by the constant current source 58 is constant, the voltage Vc increases linearly with respect to time during the interval in which the current Ic flows through the capacitor C.

An analog input voltage Vin is input across two input pins P1 and P2, although it is also possible to use a single input pin if the input voltage Vin shares a common ground with the analog-to-digital converter 50. A comparator 52 compares the input voltage Vin with the voltage Vc and produces an output signal EQL. When the input voltage Vin is approximately equal to the voltage Vc, the output signal EQL is equal to "1". Otherwise, the value of the output signal EQL is equal to "0".

A second switch 54 is electrically connected between the capacitor C and ground. Before flowing current Ic through the capacitor C, the second switch 54 should be turned on to discharge the capacitor C. Once the capacitor C is fully discharged, the second switch 54 is then turned off again. A controller 60 is used to control operation of the analog-to-digital converter 50. The controller 60 uses I/O1 and I/O2 pins to respectively control the first and second switches 56 and 54.

The controller 60 contains a timer 62 for calculating a charging time needed to charge the capacitor C. When the controller 60 turns on the first switch 56 to flow current Ic through the capacitor C, the controller 60 simultaneously turns on the timer 62 to start calculating the charging time. The controller 60 then monitors the value of the output signal EQL with an I/O3 pin to determine when the voltage Vc is equal to the input voltage Vin. When the output signal EQL is equal to "1", the controller 60 stops the timer 62 and reads the charging time calculated by the timer 62. At the same time, the first switch 56 is turned off to stop charging the capacitor C. The controller 60 then converts the charging time into a digital output voltage. The resolution of the analog-to-digital converter 50 is mainly dependent on the characteristics of the timer 62. The higher the resolution of the timer 62 is, the higher the resolution of the analog-to-digital converter 50 can be. Moreover, the clock rate of the timer 62 can be adjusted to change the resolution of the analog-to-digital converter 50. In order for the controller 60 to convert the charging time into the digital output voltage, the controller 60 will have to be calibrated according to the values of the current Ic outputted from the constant current source 58, the characteristics of the capacitor C, and the characteristics of the timer 62.

Figure 3:
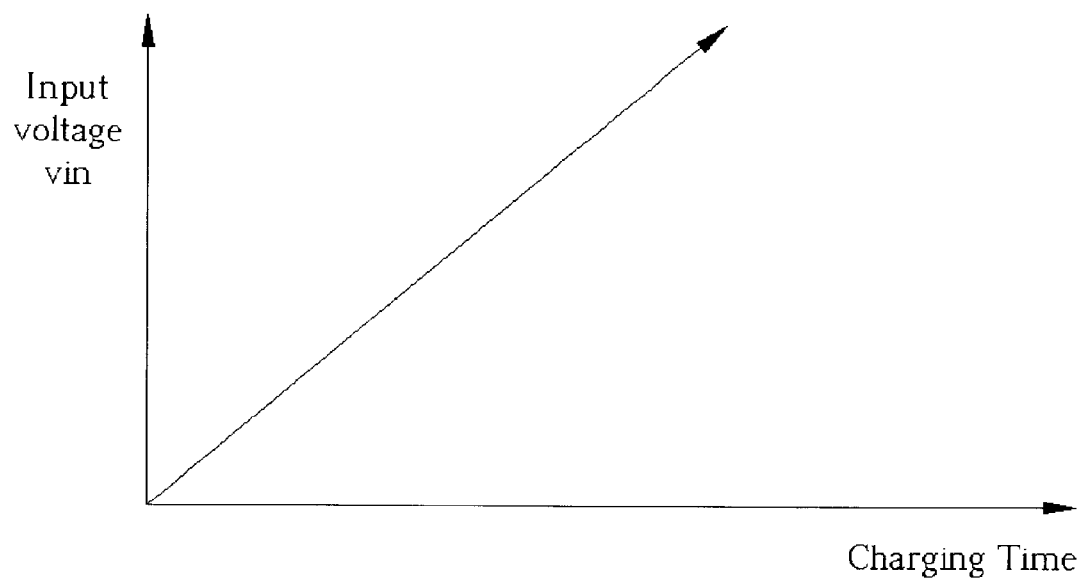
FIG. 3 is a graph showing input voltage values versus the corresponding charging times calculated by the timer.

Please refer to FIG. 3. FIG. 3 is a graph showing input voltage Vin values versus the corresponding charging times calculated by the timer 62. The fact that the voltage Vc increases linearly with the amount of time that the current Ic flows through the capacitor C enables the timer 62 to provide accurate calculation of the input voltage Vin. As FIG. 3 shows, the higher the input voltage Vin is, the longer the charging time will be until the voltage Vc becomes equal to the input voltage Vin.

Figure 4:
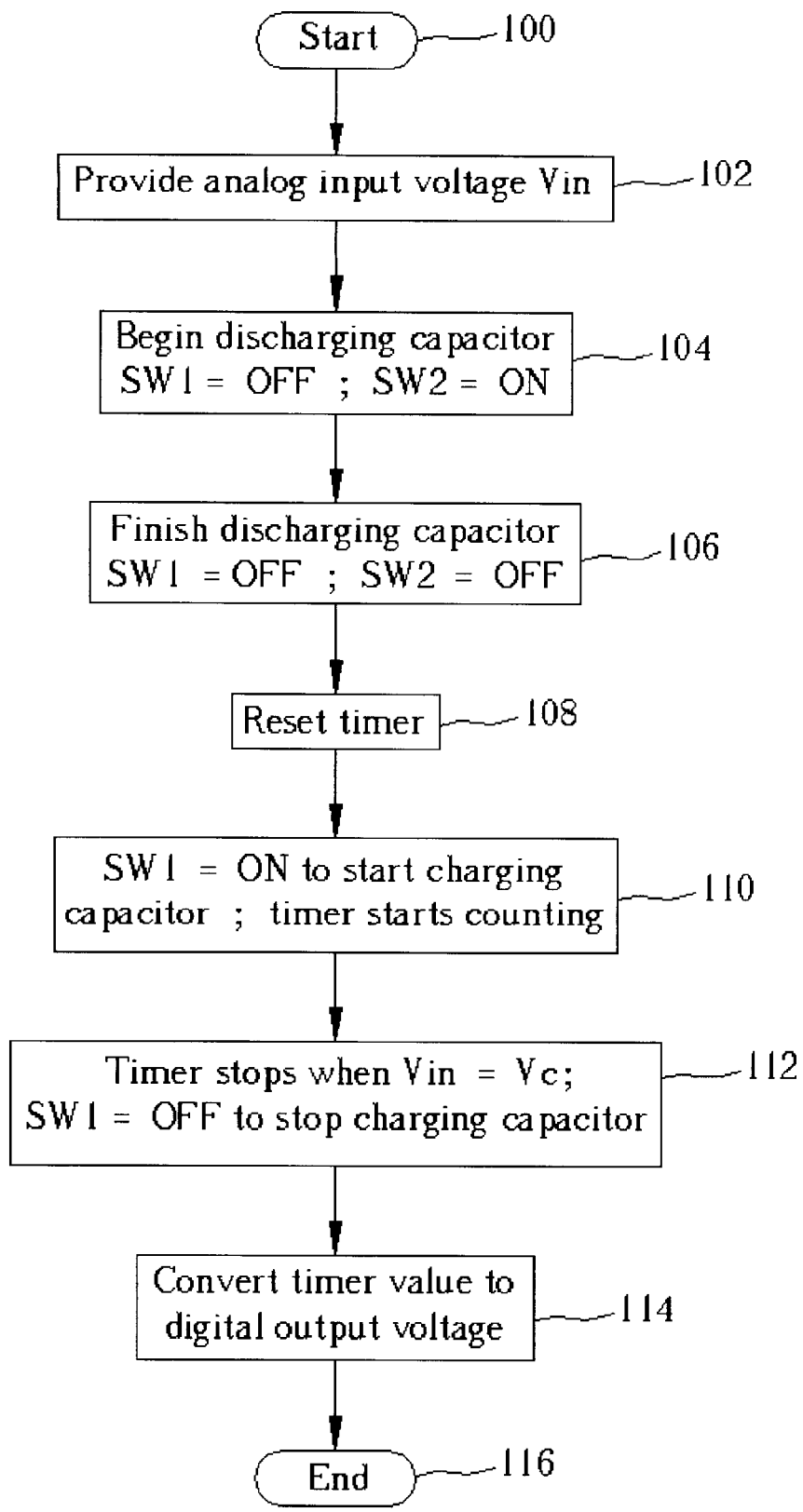
FIG. 4 is a flowchart illustrating converting the analog input voltage to a digital output voltage according to the present invention method.

Please refer to FIG. 4. FIG. 4 is a flowchart illustrating converting the analog input voltage Vin to a digital output voltage according to the present invention method. Steps contained in the flowchart will be explained below.

Step 100: Start;

Step 102: Provide an analog input voltage Vin to the two input pins P1 and P2;

Step 104: Begin discharging the capacitor C by turning on the second switch 54; during this time, the first switch 56 should be turned off so as to not allow the current Ic to flow through the capacitor C;

Step 106: After the capacitor C has been fully discharged so that voltage Vc is equal to zero, turn off the second switch 54; the first switch 56 is still turned off during this time;

Step 108: Reset the timer 62 to have a value of "0";

Step 110: Turn on the first switch 56 to begin charging the capacitor C, and simultaneously start the timer 62 to begin calculating the charging time;

Step 112: When the voltage Vc across the capacitor C is equal to the input voltage Vin, the comparator 52 generates the output signal EQL having a value equal to "1". The controller 60 reads the value of the output signal EQL, and stops the timer 62, and the first switch 56 is simultaneously turned off to stop charging the capacitor C;

Step 114: The controller 60 converts the charging time calculated by the timer 62 into a digital output voltage, thereby converting the analog input voltage Vin to the digital output voltage; and Step 116: End.

In order for the present invention analog-to-digital converter 50 to work well, the accuracy of the charging timer 62 calculated by the timer 62 is critical. The controller 60 can easily direct the starting time of the timer 62 since the controller 60 starts the timer at the same time as when the first switch 56 is turned on. To stop the timer 62, the controller 60 needs to have a means to monitor the value of the output signal EQL. To monitor the status of the output signal EQL, the controller 60 can periodically poll the value of the output signal EQL. Alternatively, the output signal EQL changing from a value of "0" to a value of "1" can generate an interrupt in the controller 60, thereby informing the controller 60 that it should stop the timer 62.

In contrast to the prior art, the resolution of the present invention analog-to-digital converter 50 can easily be adjusted by changing the characteristics of the timer 62. A clock rate of the timer 62 can be raised to provide an instant increase in the resolution of the analog-to-digital converter 50.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An analog-to-digital converter, comprising:
    at least one input pin for receiving an analog input voltage;
    a capacitor for storing charge and producing a voltage across the capacitor;
    a current source for flowing current through the capacitor for charging the capacitor;
    a first switch electrically connected between the current source and the capacitor for controlling flow of current from the current source to the capacitor;
    a comparator for outputting a first comparison value when the analog input voltage and the voltage across the capacitor satisfy a predetermined relationship;
    a timer for calculating a charging period of time needed for the analog input voltage and the voltage across the capacitor to satisfy the predetermined relationship, wherein the timer starts calculating the charging period of time when the first switch electrically connects the current source to the capacitor for charging the capacitor and stops calculating the charging period of time when the comparator outputs the first comparison value; and
    a controller for controlling operation of the first switch, for starting the timer when the first switch electrically connects the current source to the capacitor for charging the capacitor, for stopping the timer when the comparator outputs the first comparison value, and for converting the charging period of time calculated by the timer into a digital output voltage.

2. The analog-to-digital converter of claim 1 wherein the predetermined relationship between the analog input voltage and the voltage across the capacitor is satisfied when the analog input voltage is equal to the voltage across the capacitor.

3. The analog-to-digital converter of claim 1 further comprising a second switch electrically connected between the capacitor and ground, wherein the second switch electrically connects the capacitor to ground for a predetermined interval of time for discharging the capacitor before the first switch electrically connects the current source to the capacitor for charging the capacitor.

4. The analog-to-digital converter of claim 1 wherein the controller comprises a first input port for periodically polling for the presence of the first comparison value outputted from the comparator.

5. The analog-to-digital converter of claim 1 wherein the controller comprises a first input port for receiving an interrupt generated by the first comparison value outputted from the comparator.

6. The analog-to-digital converter of claim 1 wherein the current provided by the current source is a constant current.

7. The analog-to-digital converter of claim 1 wherein a relationship between the voltage across the capacitor and an amount of time that the current source flows current through the capacitor for charging the capacitor is approximately linear.

8. A method of converting an analog voltage into a digital voltage, the method comprising:

provanding a capacitor for storing charge and producing a voltage across the capacitor;

flowing a first current through the capacitor for charging the capacitor;

comparing voltages on two inputs of a comparator for determining when the analog input voltage and the voltage across the capacitor satisfy a predetermined relationship;

calculating a charging period of time from when the first current beings flowing through the capacitor until when the analog input voltage and the voltage across the capacitor satisfy the predetermined relationship; and converting the charging period of time into a digital output voltage.

9. The method of claim 8 wherein the predetermined relationship between the analog input voltage and the voltage across the capacitor is satisfied when the analog input voltage is equal to the voltage across the capacitor.

10. The method of claim 8 further comprising controlling flow of the first current through the capacitor with a first switch.

11. The method of claim 8 further comprising discharging the capacitor before the first current is flowed through the capacitor.

12. The method of claim 8 further comprising periodically comparing the voltage across the capacitor with the analog input voltage to determine if the voltage across the capacitor is approximately equal to the analog input voltage.

13. The method of claim 8 further comprising generating an interrupt when the voltage across the capacitor is approximately equal to the analog input voltage.

14. The method claim 8 wherein the first current is a constant current.

15. The method claim 8 wherein a relationship between the voltage across the capacitor and an amount of time that the first current flows through the capacitor for charging the capacitor is approximately linear.

* * * * *